United States Patent
Betsuyaku

[19]

[11] Patent Number: 6,006,919
[45] Date of Patent: Dec. 28, 1999

[54] STORAGE CONTAINER FOR PRECISION SUBSTRATES AND A POSITIONING MECHANISM THEREFOR AND A METHOD OF POSITIONING THE STORAGE CONTAINER FOR PRECISION SUBSTRATES

[75] Inventor: Takashi Betsuyaku, Itoigawa, Japan

[73] Assignee: Shin-Etsu Polymer Co., Ltd., Tokyo, Japan

[21] Appl. No.: 09/163,034

[22] Filed: Sep. 28, 1998

[30] Foreign Application Priority Data

Sep. 30, 1997 [JP] Japan .................................. 9-265525
Aug. 12, 1998 [JP] Japan .................................. 10-228283

[51] Int. Cl.⁶ .................................................. B65D 85/00
[52] U.S. Cl. ...................... 206/711; 206/454; 211/41.18
[58] Field of Search .................... 206/445, 454, 206/710–712, 832, 833; 211/41.18; 414/217; 118/500

[56] References Cited

U.S. PATENT DOCUMENTS 5,042,671  8/1991  Bischoff et al. ................... 211/41.18
5,853,214  12/1998  Babbs et al. ........................ 206/711

FOREIGN PATENT DOCUMENTS 63-82788    5/1988  Japan .
63-166948  10/1988  Japan .
9-107025    4/1997  Japan .

*Primary Examiner*—Jim Foster
*Attorney, Agent, or Firm*—Darby & Darby

[57] ABSTRACT

A container includes a container body for accommodating wafers in alignment, a multiple number of positioning parts projectively formed integrally from the undersurface of the container body, and separate frame shaped guide members each provided so as to enclose the positioning parts. The end face of each positioning part is formed with a concavity, which gradually becomes narrowed from the exterior to the interior of the concave opening. Each guide member is formed with outer end faces gradually slanted from the outermost end to the inner boundary forming guide surfaces, which are approximately continuous to the inner surface of the concavity.

17 Claims, 6 Drawing Sheets

STORAGE CONTAINER FOR PRECISION SUBSTRATES AND A POSITIONING MECHANISM THEREFOR AND A METHOD OF POSITIONING THE STORAGE CONTAINER FOR PRECISION SUBSTRATES

BACKGROUND OF THE INVENTION (1) Field of the Invention

The present invention relates to a storage container for precision substrates which is used in accommodating, storing, preserving, conveying and shipping precision substrates such as semiconductor wafers, lead frames, mask glass substrates, etc., and which is mounted in position with regard to diverse, automatic machines as well as relating a positioning mechanism therefor and to a method of positioning the storage container for precision substrates.

(2) Description of the Prior Art

For development of semiconductor chips into large-sized configurations and increase in productivity therefor, an international agreement as to large-diametric semiconductor wafers (to be referred to simply as wafers hereinbelow) was recently established. This agreement has promoted a variety of earnest study and research of semiconductor manufacturing equipment and systems and has been followed by their development. Because of this, a variety of studies and development into storage containers for precision substrates for storing and shipping wafers have been made in order to improve their durability, sealing performance, good anti-staining performance, unmanned use, automation, ease of cleaning, etc. This storage container for precision substrates will be hereinbelow described with reference to a typical case where wafers are to be contained.

In a case shown in FIG. 1, a storage container for precision substrates of this type is mainly composed of a container body 1 having a open front face 2 opening to the front, forming a front-open box configuration. A pair of aligning plates 21 having a plurality of aligning ribs 3A are attached to the interior side walls of this container body 1 using screw type fasteners. These paired aligning plates 21 horizontally support a multiple number of wafers W in alignment with their aligning ribs 3A. In other cases shown in FIGS. 2 and 3, a plurality of aligning ribs 3A are integrally molded with the interior side walls of a container body 1, arranged vertically.

Generally, a wafer W is thin and brittle and also it has an extremely low tolerance to micro-dust pollution. Therefore, during accommodating, storage, preservation, conveyance and shipping of wafers W or in the factory and while handling them during the production process, it is preferred that the wafers are kept in a clean environment free from dust and staining from sources such as the factory workers and that they are handled by an unmanned or automatic process using various automatic machines (see FIG. 3) 12 such as an unloader, automatic wafer transporting device etc. To realize handling by these automatic machines 12 while enabling high speed access (the time required for positioning correction of container body 1 and transfer is 40 seconds or less, or preferably 20 seconds or less) to improve the productivity of the semiconductor manufacturing, it is important to load the storage container for precision substrates onto a stage 13 in automatic machine 12 using a positioning means and thereby highly, precisely, position container body 1 and multiple aligning ribs 3A into a normalized position.

This positioning means can typically be made up of a mateable configuration. Illustratively, a plurality of concave members, e.g., positioning members 22 having concavities on their surface are provided on the undersurface of container body 1 while corresponding projections, that is, projected member or positioning pins 14 (to be referred to as projected members) as projected members are provided at the corresponding positions on stage 13 of automatic machine 12 so that these multiple concave members fit on positioning pins 14 to thereby precisely position and mount the storage container for precision substrates onto stage 13 in automatic machine 12.

As a specific method of providing the concave members on container body 1, a plurality of positioning members 22 (three in FIG. 1) are provided on positioning plate 23, as shown in FIG. 1, which in turn is attached to the undersurface of container body 1 using adhesive or fasteners. As another specific method, positioning members 22 may be attached directly to the undersurface of container body 1 without use of a positioning plate, as shown in FIG. 2.

There is another method shown in FIG. 3. In this case, a plurality of solid projections 24 which each extend further by at least 10 mm or more, on either side, from the external diameter of positioning pin 14 are formed integrally with the undersurface of the container body by injection molding. The distal end of each projection 24 is formed with a concave face so that the projection is sectionally configured in an inverted V-shape. The center of this concave bottom is used as a positioning concavity 8A while the slanting surfaces on both sides defining concavity 8A are used as guide surfaces 11A so that positioning pin 14, if it is displaced, can be fitted into concavity 8A with the help of these guide surfaces 11A. Here, in FIG. 3, a gap is shown between positioning pin 14 and concavity 8A, this is just for convenience sake to depict the structure, and positioning pin 14 of course abuts concavity 8A in an actual case.

Prior art relating to storage containers for precision substrates of this type has been disclosed in Japanese Utility Model applications Laid-Open Sho 63 No. 82,788 and Sho 63 No. 166,948 and Japanese Patent Application Laid-Open Hei 9 No. 107,025.

Since the concave members are provided for container body 1 in a manner described above, the storage container for precision substrates has suffered from various problems as follows:

First, when the concave members are attached to container body 1 by using, or without using, positioning plates 23 as separate parts, positioning plates 23 and/or concave members are attached using adhesive or fasteners. Therefore, an error more than ±0.2 mm arises when it is assembled or attached, producing difficulties in keeping it in position. This causes a risk of damage to wafers W when wafers W are taken in or out with respect to automatic machine 12.

Further, since guide surfaces 11A which perform guidance functions are also injection molded at the same time as container body 1 and projections 24 are integrally formed by injection molding, shrinkage, i.e., warpage or distortion occurs at projections 24 and thereabout due to molding shrinkage because the thickness of the container at projections 24 locally becomes much greater about five times as great as that of the other part of container body 1. Therefore, it is impossible to expect the dimensions to fall within a precision range within ±0.2 mm. In order to eliminate this problem, the parting joints in the mold may be shaped so as to avoid projections 24. However, this makes it difficult to release the container body from the mold, needs a complicated mold configuration and increases the number of mold parts and degrades the productivity. Moreover, when guide surfaces 11A are integrally formed by injection molding, it is no longer possible to change the length, angle and other dimensions of guide surfaces 11A after injection molding. Therefore, the resulting product can only be handled by automatic machines 12 of identical specifications, having no flexibility in its use.

SUMMARY OF THE INVENTION

The present invention has been devised in view of what is discussed above and it is therefore an object of the present invention to provide a storage container for precision substrates, which is free from molding defects such as shrinkage, degradation of the productivity when it is manufactured by a molding technique such as injection molding etc. It is also an object of the present invention to provide a storage container for precision substrates, which provides high precision for positioning and can readily deal with various machines having diverse specifications, as well as a structure for positioning the container and a method of positioning the storage container for precision substrates.

The present invention has been devised to attain the above objects, and the present invention is configured as follows:

In accordance with the first aspect of the invention, a storage container for precision substrates, comprises:

a container body accommodating precision substrates;
a plurality of positioning means which are integrally molded on one face (one surface which is at least in parallel with the plane of the accommodated precision substrates) of the container body in projected forms; and
separate guide members each having outer end faces located at least on the sides around each positioning means, and is characterized in that the end face of each positioning means is shaped in a concave form which gradually becomes narrowed from the exterior to the interior of the concave opening, and the outer end faces of each guide member are formed gradually slanted from the exterior to the interior so as to form guide faces which are approximately continuous to the surface of the concavity.

In accordance with the second aspect of the invention, a storage container for precision substrates, having a container body accommodating precision substrates which has a plurality of projections molded on the undersurface thereof, is characterized in that:

each projection is composed of a thin walled positioning means (of 0.5 mm to 5 mm thick, preferably 1 mm to 4 mm thick) projectively molded integrally with the undersurface of the container body and a separate guide member having outer end faces located at least on both sides around the positioning means;
the front end face of the positioning means is formed with a concavity, which gradually becomes narrowed from the exterior to the interior of the concave opening; and
the outer end faces of the guide member are formed gradually slanted from the exterior to the interior so as to form guide faces which are approximately continuous to the surface of the concavity.

In accordance with the third aspect of the invention, a positioning structure for a storage container for precision substrates, having a container body accommodating precision substrates has a plurality of projections molded on the undersurface thereof, is characterized in that:

each projection is composed of a thin walled positioning means projectively molded integrally with the undersurface of the container body and a separate guide member having outer end faces located at least on both sides around the positioning means;
the front end face of the positioning means is formed with a concavity, which gradually becomes narrowed from the exterior to the interior of the concave opening; and
the outer end faces of the guide member are formed gradually slanted from the exterior to the interior so as to form guide faces which are approximately continuous to the surface of the concavity.

In accordance with the fourth aspect of the invention, the storage container for precision substrates having the above first feature, further comprises a bottom plate positioned under the undersurface of the container body, wherein the bottom plate is provided with a plurality of passage holes and guide members formed on, which each have outer end faces located at least on both sides around each positioning means.

In accordance with the fifth aspect of the invention, the storage container for precision substrates having the above second feature further comprises a bottom plate positioned under the undersurface of the container body, wherein the bottom plate is provided with a plurality of passage holes and guide members formed on, which each have outer end faces located at least on both sides around each positioning means.

In accordance with the sixth aspect of the invention, the storage container for precision substrates having the above fourth feature is characterized in that each guide member is made to reside in close contact with the corresponding positioning means.

In accordance with the seventh aspect of the invention, the storage container for precision substrates having the above fifth feature is characterized in that each guide member is made to reside in close contact with the corresponding positioning means.

In accordance with the eighth aspect of the invention, the storage container for precision substrates having the above fourth feature is characterized in that an engaging recess is formed in the opposing face of either the guide member or the positioning member while an engaging projection is formed in the opposing face of the other so that the engaging recess and projection mate with each other.

In accordance with the ninth aspect of the invention, the storage container for precision substrates having the above fifth feature is characterized in that an engaging recess is formed in the opposing face of either the guide member or the positioning member while an engaging projection is formed in the opposing face of the other so that the engaging recess and projection mate with each other.

In accordance with the tenth aspect of the invention, the storage container for precision substrates having the above sixth feature is characterized in that an engaging recess is formed in the opposing face of either the guide member or the positioning member while an engaging projection is formed in the opposing face of the other so that the engaging recess and projection mate with each other.

In accordance with the eleventh aspect of the invention, the storage container for precision substrates having the above seventh feature is characterized in that an engaging recess is formed in the opposing face of either the guide member or the positioning member while an engaging projection is formed in the opposing face of the other so that the engaging recess and projection mate with each other.

In accordance with the twelfth aspect of the invention, the storage container for precision substrates having the above first feature is characterized in that the positioning means is formed of a pair of positioning ribs projected from the undersurface of the container body so as to be opposed to each other, and the outer end face of the paired positioning ribs is molded so that the section thereof is in an approximately V-shape.

In accordance with the thirteenth aspect of the invention, the storage container for precision substrates having the above second feature is characterized in that the positioning means is formed of a pair of positioning ribs projected from the undersurface of the container body so as to be opposed to each other, and the outer end face of the paired positioning ribs is molded so that the section thereof is in an approximately V-shape.

In accordance with the fourteenth aspect of the invention, the storage container for precision substrates having the above twelfth feature is characterized in that a reinforcing rib is provided across the gap between the pair of positioning ribs.

In accordance with the fifteenth aspect of the invention, the storage container for precision substrates having the above thirteenth feature is characterized in that a reinforcing rib is provided across the gap between the pair of positioning ribs.

In accordance with the sixteenth aspect of the invention, a method for positioning and mounting a storage container for precision substrates on a stage of an automatic machine, wherein the storage container for precision substrates comprising: a container body accommodating precision substrates; a plurality of positioning means which are integrally molded on one face of the container body in projected forms; and separate guide members each having outer end faces located at least on the sides around each positioning means, and the end face of each positioning means is shaped in a concave form which gradually becomes narrowed from the exterior to the interior of the concave opening, and the outer end faces of each guide member are formed gradually slanted from the exterior to the interior so as to form guide faces which are approximately continuous to the surface of the concavity, is characterized in that, when a plurality of positioning pins of the automatic machine are in alignment with the multiple positioning means of the container body, the container is positioned so that each concave portion of the positioning means fits on the corresponding positioning pin, whereas when the multiple positioning pins are displaced from the corresponding multiple positioning means, the container is positioned so that each positioning pin is slid, whilst being in contact with the guide surface of the guide member, into the corresponding concavity of the positioning means.

In accordance with the seventeenth aspect of the invention, a method for positioning and mounting a storage container for precision substrates on a stage of an automatic machine, wherein the storage container for precision substrates has a container body for accommodating precision substrates which has a plurality of projections molded on the undersurface thereof, and each projection is composed of a thin walled positioning means projectively molded integrally with the undersurface of the container body and a separate guide member having outer end faces located at least on both sides around the positioning means; the front end face of the positioning means is formed with a concavity, which gradually becomes narrowed from the exterior to the interior of the concave opening; and the outer end faces of the guide member are formed gradually slanted from the exterior to the interior so as to form guide faces which are approximately continuous to the surface of the concavity, is characterized in that, when a plurality of positioning pins of the automatic machine are in alignment with the multiple positioning means of the container body, the container is positioned so that each concave portion of the positioning means fits on the corresponding positioning pin, whereas when the multiple positioning means are displaced from the corresponding multiple positioning pins, the container is positioned so that each positioning pin is slid, whilst being in contact with the guide surface of the guide member, into the corresponding concavity of the positioning means.

Here, the precision substrate in the invention mainly indicates semiconductor wafer(s) (silicon wafer(s) etc.), including a semiconductor wafer of a large-diametric type (300 mm), and may be provided in singular or plural, (e.g., 13 or 25 pieces). However, the precision substrate should not be necessarily limited to semiconductor wafers. That is, examples of precision substrates include at least a single or plural liquid crystal cell(s), quartz glass substrate, mask substrate and the like which will be used in the electric and electronic fields.

The container body can be injection molded using a resin such as polycarbonate, acrylic resin, polybutylene terephthalate, polypropylene or the like or made using ceramics etc. This container body can be subjected to a transparentizing treatment and/or anti-static treatment as required. The wall thickness of the container body is determined as appropriate depending upon the size of the container body, that is, the size of the precision substrates to be accommodated therein. As an example, in a case where 300 mm wafers are stored in the container body, the average thickness is preferably 3.5 mm to 5.0 mm.

The positioning means and guide members can be formed by injection molding using a transparent or solid colored polyolefin such as PE, PP etc., a thermoplastic resin such as ABS, PS, PC, PBT, PEEK, PEI etc., a thermoplastic elastomer of polyesters, polyolefins or polystyrenes, or by using ceramics as a molding material. In particular, a thermoplastic resin is preferably used because of its lubricating abilities.

The positioning means can be injection molded in a columnar form, a cylinder, an elliptic cylindrical form, a polygonal prism, or the like. The number and the sites of the positioning means to be injection molded can be varied as required. For example, the positioning means is preferably formed at three sites, but can be formed at four, five or more sites. In such a case, the positioning means is formed at each vertex of a regular polygon. The shape within the concavity of the positioning means may be made up of inclined surfaces, or a curved surface, a hemispherical surface, hyperbolic, or the like as long as the concavity gradually becomes narrowed from the exterior to the interior of the concave opening.

The outer end faces of the guide member may and should at least be formed on both sides or wholly peripheral to each positioning means, and are preferably injection molded in a cylindrical form such as a circular or elliptic shape, or a rectangular frame form or a U-shaped form. This guide member does not have to be of a single component. For example, a pair of flat U-shaped parts may be assembled as a guide member, which is fitted into the positioning means. It is also possible to tightly fix the guide member to the positioning means or to fix the guide members to the container body by adhesive or detachably fix it with a plurality of screws, etc. It is also possible to fix the guide member by forming a recess in the undersurface of the container body and a mating projection in the guide member by injection molding or any other molding technique so that these recess and projection may mate with each other.

The guide surface of the guide member may be linearly inclined or curvingly inclined as long as it slopes gradually lowers from the outer side of the guide member to the inner side where the positioning means lies. The modes for joining the guide surface with the interior surface of the concavity in an approximately continuous fashion, include: a mode in which the guide surf ace and the interior surface of the recess are jointed with a small gap so as to form an approximately continuous surface; a mode in which the guide surface and the interior surface of the recess are joined without any gap to form a continuous surface; a mode in which the guide surface and the interior surface of the concavity are joined with a slight step to form an almost continuous surface; and a mode which is the combination of these.

As to the bottom plate, it is possible to injection mold it in a flat, approximately Y-shaped form, in a flat, approximately V-shaped form, in a flat approximately semi-elliptic form, or the like. It is possible to provide a guide member around each passage hole of the bottom plate by forming it integrally by injection molding or by attaching it using adhesive or detachably attaching it using a plurality of screws, etc. Further, in mentioning the approximately V-shaped section of the paired positioning ribs it should be understood that the shape is based on its technological function, so that examples of this shape include an approximate, inverted horn-like section, an approximate funnel-like section, a parabolic or semicircular section etc.

The reinforcing rim may be provided in singular or in plural. Further, automatic machines indicate those used for mounting the storage container for precision substrates, which are used in SMIF (Standard Mechanical Interface: the means for mechanically supplying or collecting wafers with respect to semiconductor manufacturing equipment in a locally clean space without any direct operation of the factory workers) or the like. Specific examples include openers, semiconductor wafer processors, automatic transfer machines and the like.

In accordance with the above first, second and third features of the invention, a plurality of positioning means are integrally molded on one surface of the container body, preferably on the undersurface thereof, so that it is no more necessary to attach positioning means to one surface or the undersurface of the container body with adhesive or using fasteners, which would easily cause error. Since the undersurface of the container body is molded with the minimum number of positioning means only, the thickness of the positioning means can be as thin as that of the container body or less than it. Since the guide members are provided separately from the positioning means, it is possible to adapt the container to various automatic machines having different specifications, by modifying the shape of the guide members appropriately depending upon the configuration of the positioning pins.

In accordance with the fourth and fifth features of the invention, the outer end faces of each guide member are positioned at least on both sides around the corresponding positioning means when the bottom plate is attached to the bottom surface of the container body. Accordingly, it is possible to finish the mounting of the multiple number of guide members, each having outer end faces located at least on both sides around each positioning means, all at once.

In accordance with the sixth and seventh features of the invention, the guide member is attached tightly in close contact with the positioning means so as not to create any gap. Accordingly, it is possible to quickly set the bottom plate to the undersurface of the container body without using any fasteners such as screws.

In accordance with the eighth through eleventh features of the invention, when the bottom plate is attached to the undersurface of the container body, the engaging recess and engaging projection mate each other so that the container can support the bottom plate.

In accordance with the twelve and thirteen features of the invention, when the storage container for precision substrates is positioned on the stage of an automatic machine, each of the positioning pins of the automatic machine fits into the concavity defined by the exterior parts of paired positioning ribs, so that the storage container for precision substrates can be positioned with high precision with respect to the automatic machine.

In accordance with the fourteen and fifteenth features of the invention, the integrally formed reinforcing rib prevents the paired positioning ribs from warping or deforming in a direction closer together or further apart, so as to improve the rigidity of the paired positioning ribs.

In accordance with the sixteenth and seventeenth features of the invention, when the storage container for precision substrates is positioned on the stage of an automatic machine, each concavity of the positioning means is fitted on the corresponding positioning pin so that the storage container for precision substrates can be positioned with high precision with respect to the automatic machine, and hence it is possible to position the multiple aligning ribs with high precision with respect to the automatic machine.

In contrast, when the positioning means is displaced from the corresponding positioning pin, the guide surface of each guide member abuts the corresponding positioning pin and hence guides the positioning pin so that the concavity of the positioning means can be guided from a displaced position to correct position. Thus, each positioning pin can be fitted into the corresponding concavity so that it is possible to position and mount the storage container for precision substrates with high precision.

DESCRIPTION OF THE PREFERRED EMBODIMENTS

The embodiments of the present invention will hereinbelow be described with reference to the accompanying drawings, but the present invention should not be limited by the following embodiments.

Figure 1:
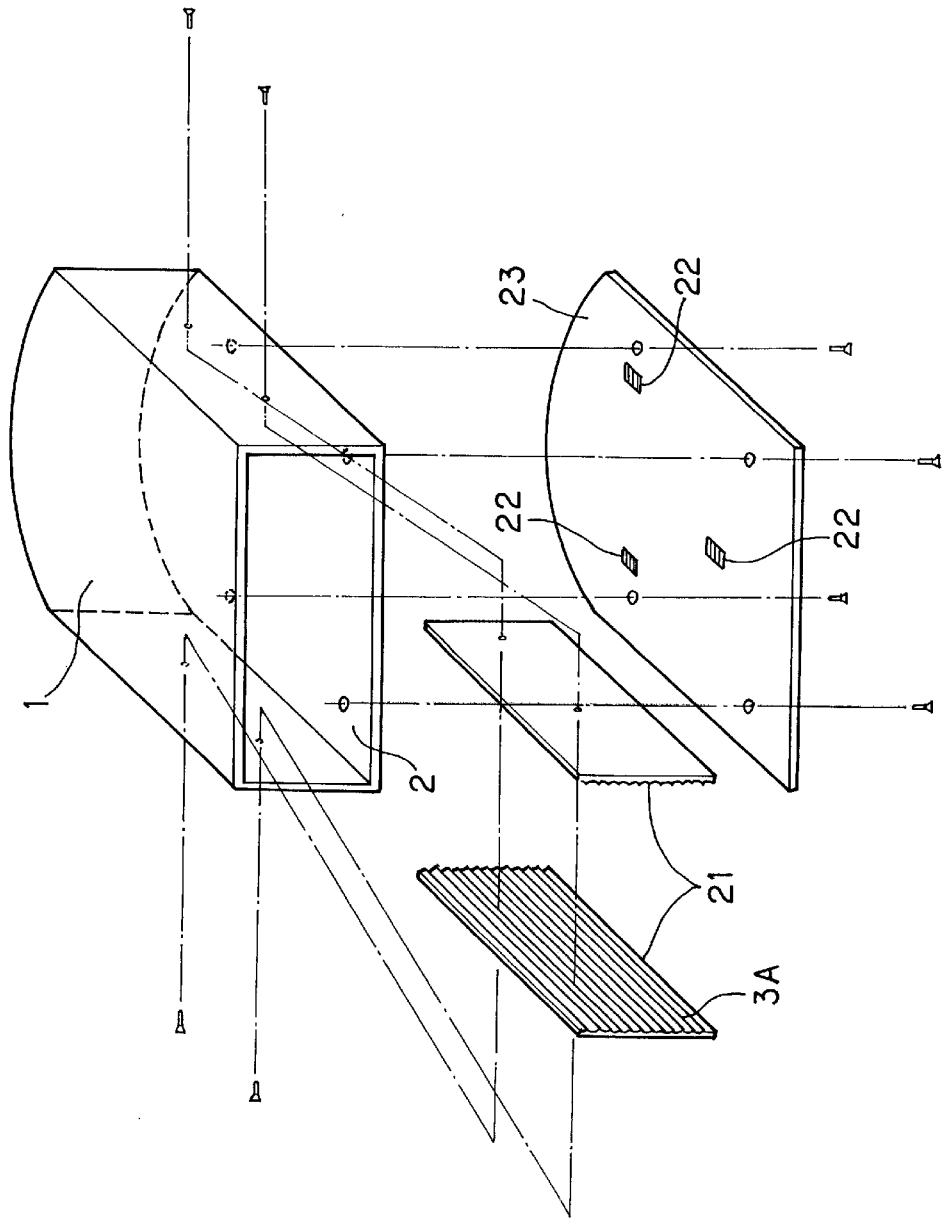
FIG. 1 is an illustrative exploded perspective view showing a positioning means of a separate type for a storage container for precision substrates.
Figure 2:
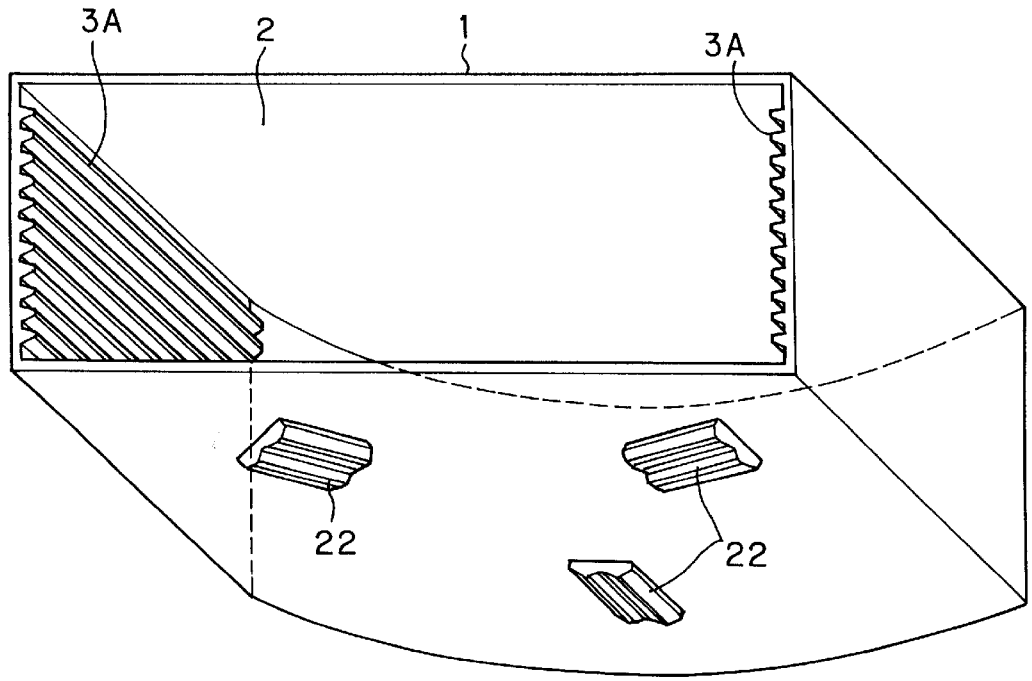
FIG. 2 is an illustrative perspective view showing a storage container for precision substrates of an integral molding type.
Figure 3:
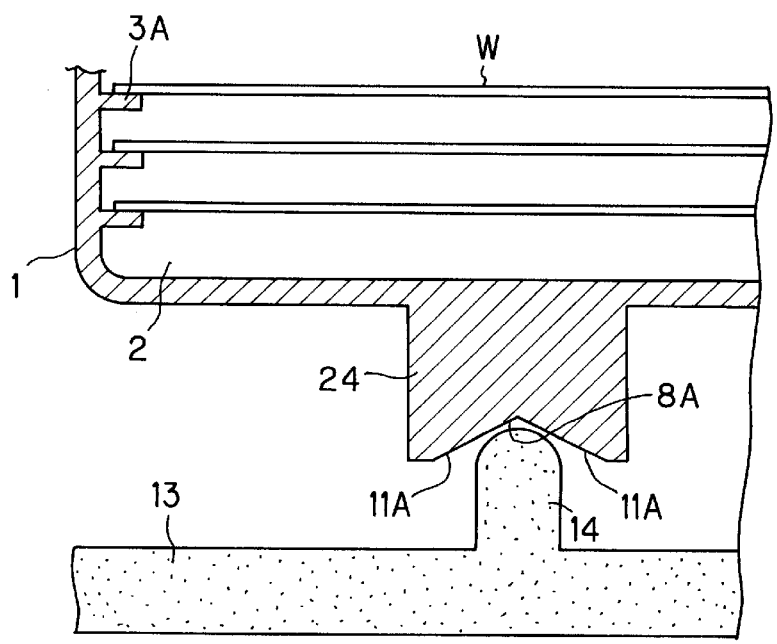
FIG. 3 is an illustrative vertical sectional view showing a positioning means of an integral molding type for a storage container for precision substrates.
Figure 4:
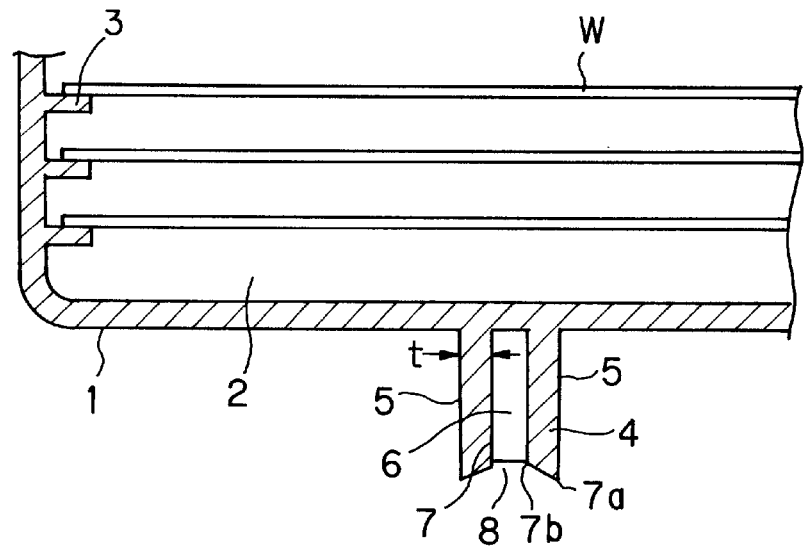
FIG. 4 is an illustrative vertical sectional view for illustrating the embodiment of a storage container for precision substrates, a positioning mechanism therefor and a method of positioning the storage container for precision substrates in accordance with the present invention, where a guide member have yet to be set.
Figure 5:
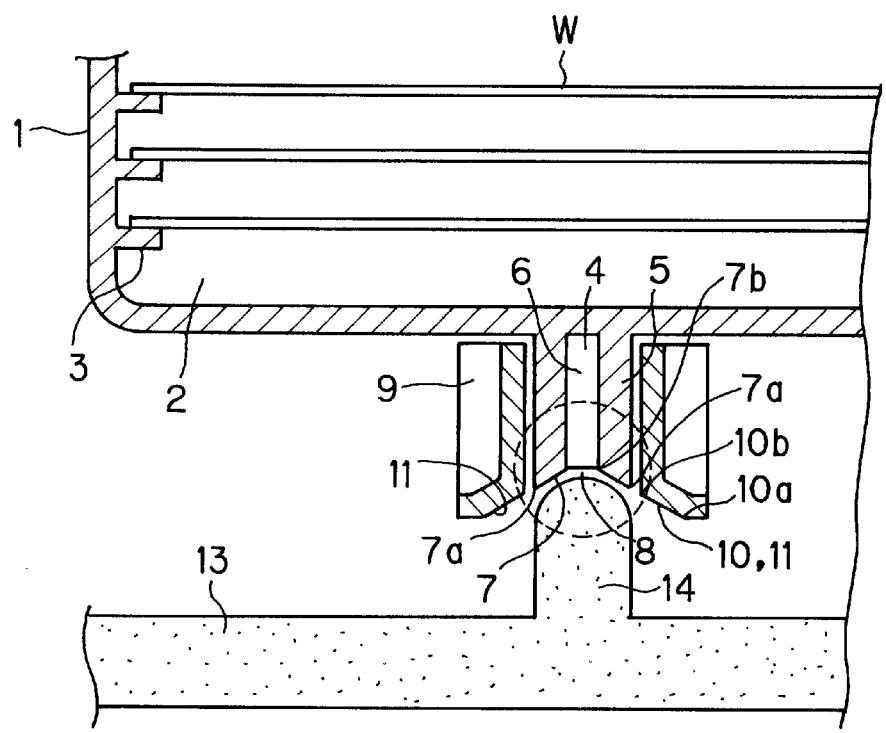
FIG. 5 is an illustrative vertical sectional view for illustrating the embodiment of a storage container for precision substrates, a positioning mechanism therefor and a method of positioning the storage container for precision substrates in accordance with the present invention, where a guide member have been set.
Figure 6:
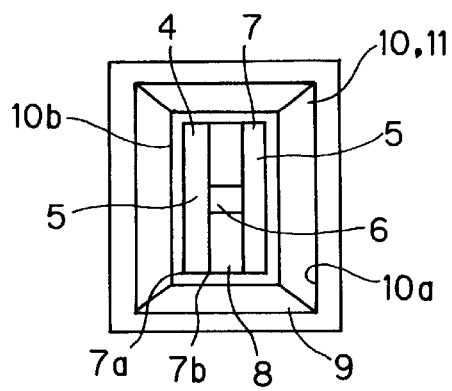
FIG. 6 is an essential bottom view for illustrating the embodiment of a storage container for precision substrates, a positioning mechanism therefor and a method of positioning the storage container for precision substrates in accordance with the present invention.

The storage container for precision substrates and its positioning structure and the positioning method for the storage container for precision substrates are configured, as shown in FIGS. 4 through 6, so that a plurality of positioning means 4 are integrally formed on the undersurface of a container body 1 by injection molding while a separate guide member 9 is fitted on so as to enclose, fit all around, each positioning means 4.

Container body 1 is made up of a molding material excellent in mechanical properties, anti-staining performance and moldability, and is formed by injection molding into a front-opening body configuration having a front face 2, opening to the front, with a curved rearside that corresponds to the shape of wafers W. A door (see FIG. 10) is provided so as to detachably fit to front face 2 to enclose the opening of container body 1 in a sealable manner. Formed integrally on the inner side walls of container body 1 are a plurality of aligning ribs 3 which are vertically arranged with regular intervals (e.g., with a pitch of 10 mm). Accordingly, a plurality (e.g., 25 pieces) of wafers W are arranged vertically in an almost stacking manner and supported by these aligning ribs 3.

A multiple number (three in this embodiment) of positioning means 4 are integrally formed by injection molding, one at the center of the front of the undersurface of container body (only this one is shown in FIGS. 4 and 5), one at one side in the rear part of the undersurface and one on the other side of the rear part of the undersurface. Each positioning means 4, as shown in FIG. 6, comprises a pair of positioning ribs 5 projecting from container body 1 and a reinforcing rib 6 of about 4 mm thick integrally formed between the pair of positioning ribs 5, forming an H-shaped configuration in bottom view.

A pair of positioning ribs 5, each being injection molded in a bar shape of 40 mm long and 20 mm high are arranged opposing each other with a 4 to 10 mm apart from each other.

The thickness t of each positioning rib 5, shown in FIG. 4, is not particularly limited as long as no molding warpage occurs, but is usually selected as appropriate from the range of 0.5 to 5 mm, or preferably 1 mm to 4 mm when it is formed of a synthetic resin. Each positioning rib 5 has an end face (underside face) 7 which is formed slanted at an angle of about 15° to 60° with respect to the bottom surface, from topmost point 7a on the outer side to the opposite side or to lowermost point 7b on the inner side. Accordingly, end faces 7 of paired positioning ribs 5 and reinforcing rib 6 define a concave portion 8 having an inverted bowl shaped or an inverted funnel shaped section.

Each guide member 9 is injection molded in a rectangular frame shape of about 15 mm wide and the height is formed greater than the height of ribs 5 so that when it is fitted onto the positioning means, the lowermost of guide member 9 extends lower (toward the lower side in FIGS. 4 and 5) than end face 7 of paired positioning ribs 5. As shown in FIG. 5, end face (underside face) 10 of each guide member 9 is formed slanted at an angle of about 15° to 60° from the lowermost point 10a on the outer side to the inner side 10b, functioning as a guide face 11. Accordingly, when each guide member 9 is fitted on positioning means 4 as shown in FIG. 5, end face 10 of guide member 9 and end face 7 of positioning rib 5 form a continuous end face with a slight clearance in between.

Here, a clearance may either be formed or not between positioning means 4 and guide member 9. When the clearance is formed, it is equal to or narrower than half the diameter of positioning pin 14, or more preferably one-tenth of it. The width, shape and configuration of guide member 9, is formed in association with the shape and configuration of positioning pin 14 of stage 13 of automatic machine 12. Here, in FIG. 5, a gap is shown between positioning pin 14 and end face 7 of positioning rib 5, this is just for convenience sake to depict the structure, and positioning pin 14 of course abuts end face 7 in an actual case.

In the above configuration, when container body 1 is conveyed by automatic machine 12, the storage container for precision substrates is positioned and mounted on stage 13 of automatic machine 12 in the following manner. That is, guide members 9 are attached beforehand to multiple positioning means 4 of container body 1 using adhesive or a plurality of screws. Then, each concave portion 8 between paired positioning ribs 5 is placed on the corresponding positioning pin 14, having a round tip, of automatic machine 12 so that each positioning means may be made in contact at two points. By this configuration, it is possible to precisely position and set the storage container for precision substrates to automatic machine 12 within an accuracy of ±0.25 mm and hence it is possible to spatially position plurality of aligning ribs 3 with high precision with respect to automatic machine 12. (As to this point, see the encircled part in FIG. 5).

Upon positioning, even if the point defined between paired positioning ribs 5 is set displaced to either the left or right side within ±10 mm relative to the corresponding positioning pin 14, guide face 11 of guide member 9 in contact with each positioning pin 14 acts as a guide surface to thereby smoothly guide the paired positioning ribs 5 of positioning means 4 slidingly from the displaced position to the normal position. Accordingly, the storage container for precision substrates is positioned and mounted to automatic machine 12 with high precision.

In accordance with the above configuration, since multiple positioning means 4 are integrally formed with the undersurface of container body 1 by injection molding, there is no need to attach positioning ribs 5 using adhesive or fasteners. Accordingly, it is possible to markedly effectively reduce the positioning error due to assembly or attachment error, whereby it is possible to definitely eliminate the risk of damage to wafers W. Further, since positioning means 4 to be injection molded on the undersurface of container body 1 is designed to be minimal in its dimensions, no thick portion will be formed more than one and half times as thick as the other part of container body 1. Therefore it is possible to prevent molding failures such as shrinkage etc. For example, when PC is used to mold a container body 1, the molding shrinkage is 5/1000 to 7/1000 (in the case where the wall thickness is 3 to 5 mm) but tends to increase as the wall thickness increases. Accordingly, it is preferable from a view point of preventing molding failures that the wall thickness of container body 1 is regulated so as to be as uniform as possible.

Further, since guide members 9 are provided in a separate and detachable form, it is possible to mold guide members 9 suitable to the configuration of positioning pins 14. This means that the shape of guide member 9 and the length, angle and the like of guide surface 11 can be modified very easily so that it can readily deal with various automatic machines 12 having different specifications. Hence it is possible to markedly effectively avoid the mold becoming complicated and avoid releasing failure of the molding, whereby it is possible to sharply reduce the cost for the mold as well as markedly improve the production efficiency. Since only guide members 9 are provided in a separated form, it is possible to minimize the number of parts and hence reduce the number of production steps and inspection steps, resulting in a further improvement of the productivity. Further, since reinforcing rib 6 is integrally provided between a pair of positioning ribs 5, it is possible to improve the positioning accuracy and strength with a simple configuration.

Figure 7:
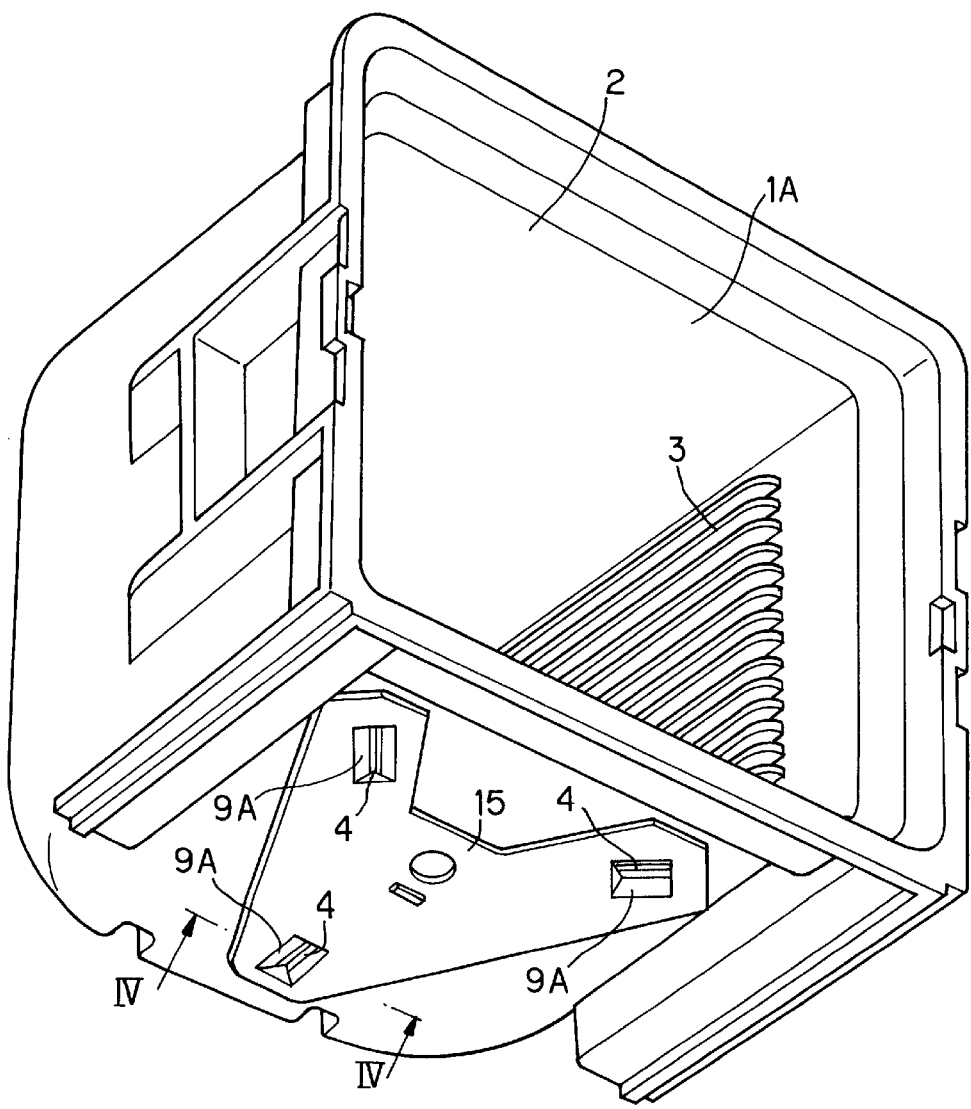
FIG. 7 is an illustrative perspective view showing the second embodiment of a storage container for precision substrates, a positioning mechanism therefor and a method of positioning the storage container for precision substrates in accordance with the present invention.
Figure 8:
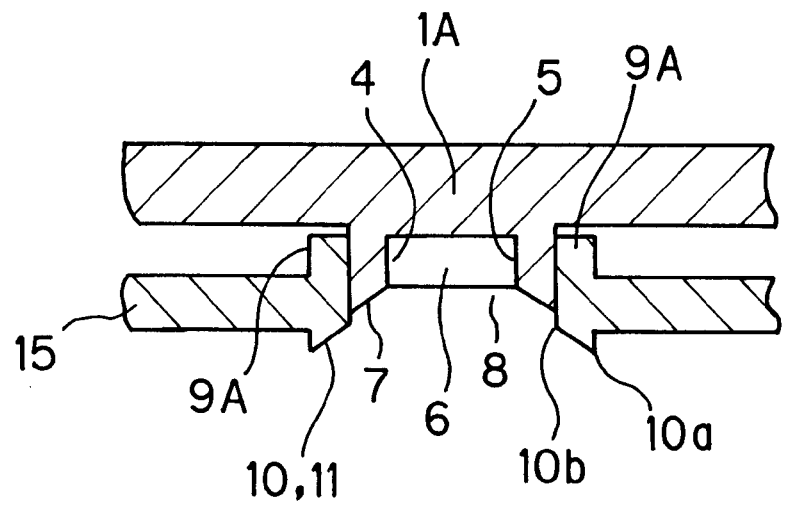
FIG. 8 is a sectional view cut on IV—IV line in FIG. 7.

Next, FIGS. 7 and 8 show a second embodiment of the invention. In this case, a container body 1A called pod has a detachable bottom plate 15 positioned on the undersurface thereof. This bottom plate 15 is used to position and fix container body 1A onto a stage 13 of an automatic machine 12.

Bottom plate 15 is injection molded into an approximately V-shaped plate using a synthetic resin such as PP, PC, PBT, PEEK, PEI or the like. Formed in the front parts (upper right in FIG. 7) and in the rear part (lower left in FIG. 7) are passage holes. A rectangular frame-shaped guide member 9A is integrally formed by injection molding around each passage hole. As shown in FIG. 8, each guide member 9A is integrally injection molded so that its width is narrower by about 0.01 to 0.6 mm than that of positioning means 4. Other specifications are the same as the above embodiment so that the description will not be repeated.

Also in this embodiment, the same effects as above can be obtained, and further, assembly work for attaching guide members 9A to respective positioning means 4 can be finished all at once, thus apparently making it possible to markedly improve the efficiency of the assembly of the storage container for precision substrates. Further, since guide members 9A are tightly press fitted onto positioning means 4, it is possible to firmly fix bottom plate 15 to container body 1A in a simple manner by making use of the retaining force generated from the resiliency of the material and frictional resistance between positioning means 4 and guide member 9A.

Figure 9:
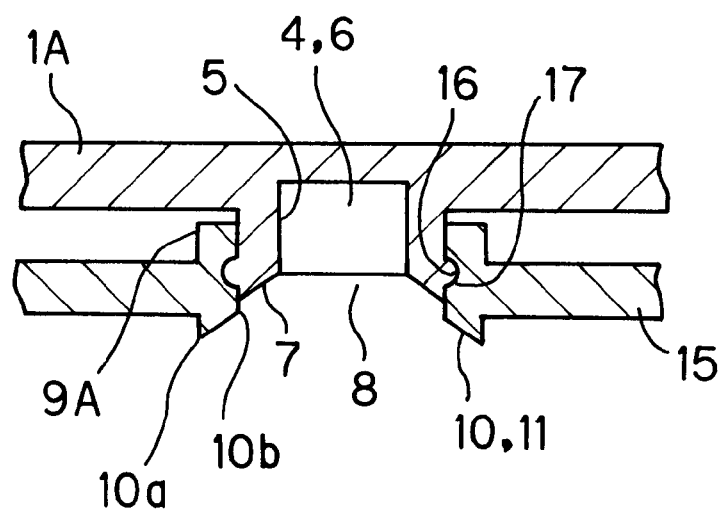
FIG. 9 is an illustrative perspective view showing the third embodiment of a storage container for precision substrates, a positioning mechanism therefor and a method of positioning the storage container for precision substrates in accordance with the present invention.

Next, FIG. 9 shows a third embodiment of the invention. In this case, a pair of engaging projected portions 16 having a semicircular section are injection molded on both left and right sides of positioning means 4 of the second embodiment, or in other words, on the outer surfaces of paired positioning ribs 5, while a pair of engaging recessed portions 17 having a semicircular section are injection molded on both left and right side parts of guide member 9A. So these engaging recessed portions 17 and engaging projected portions 16 fit each other. Other configurations are the same as the above embodiment so that the description will not be repeated.

Also in the above embodiment, the same effects as above can be obtained. Further, since engaging recessed portions 17 and engaging projected portions 16 are adapted to fit each other it is obviously possible to further firmly fix bottom plate 15 to container body 1A.

In the above embodiments, container body 1 or 1A shown in FIGS. 4 and 7 is used but the configuration of the container bodies is not limited to these. For example, container body 1 or 1A may be formed by injection molding a hollow cylinder having a front face 2, opening to the front, with a plurality of aligning ribs 3 integrally molded on the interior side walls and on the interior rear wall thereof. It is also possible to forming a double layered structure in a such a manner that container body 1 or 1A, as an inner box, is accommodated in a transparent external box having a transparent door on the face thereof over the opening, to thereby improve storage, preservation, transportation, conveyance and handling performances. In this case, the external box and door can be injection molded in an appropriate form such as circular, rectangular or any other convenient shape.

Figure 10:
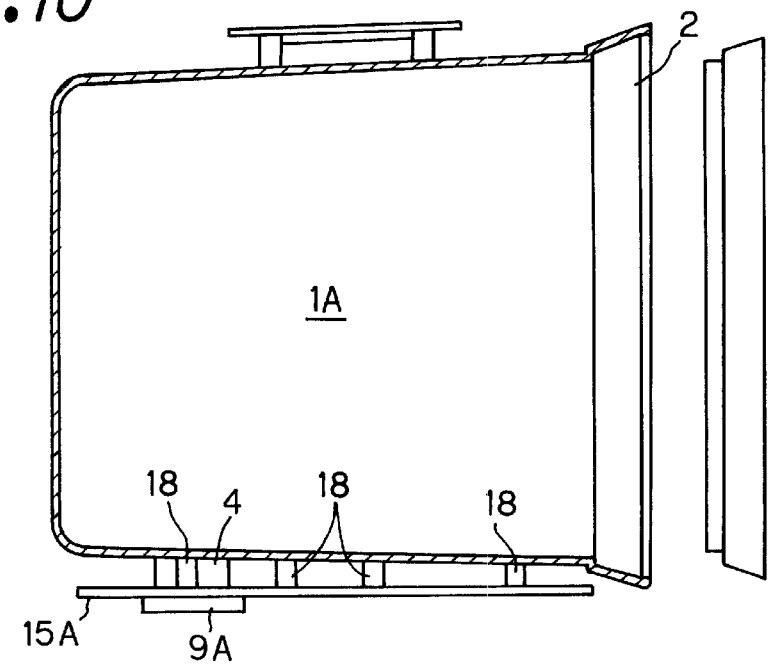
FIG. 10 is an illustrative perspective view showing a variational embodiment of a storage container for precision substrates, a positioning mechanism therefor and a method of positioning the storage container for precision substrates in accordance with the present invention.

It is also possible to detachably attach separate columns having a plurality of aligning ribs to the interior side walls of container body 1A. Further, as shown in FIG. 10, it is also possible to injection mold a plurality of bosses 18 on the undersurface of container body 1A in the second or third embodiment, and fix a bottom plate 15A to these bosses 18 using screw-type fasteners such as bolts etc., to achieve a further firm attachment. In this case, some uniform gaps may be formed between positioning means 4 and guide member 9A in the second or third embodiment.

Figure 11:
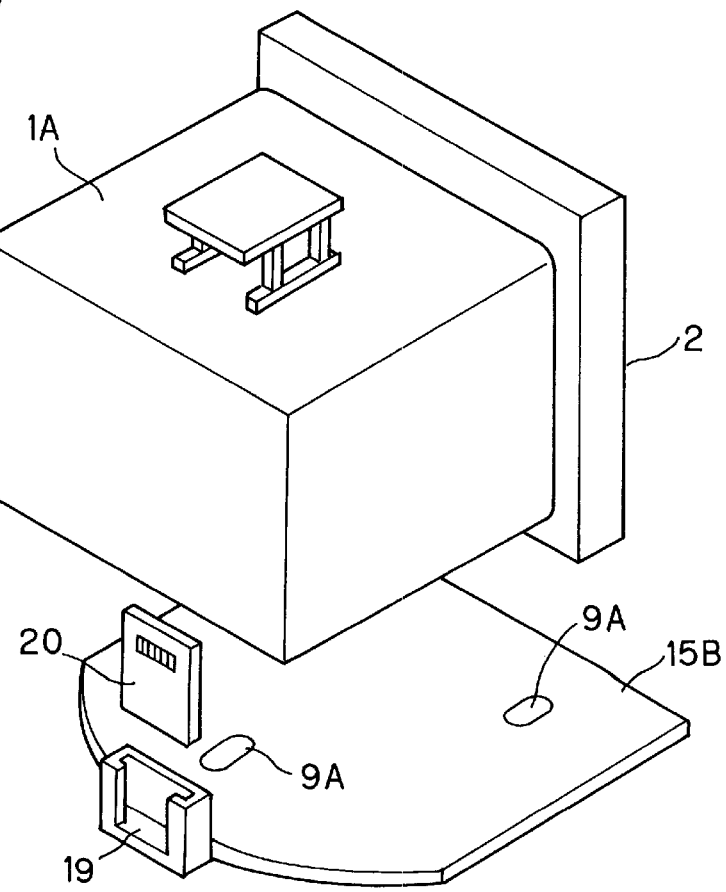
FIG. 11 is an illustrative perspective view showing another variational embodiment of a storage container for precision substrates, a positioning mechanism therefor and a method of positioning the storage container for precision substrates in accordance with the present invention.

As shown in FIG. 11, a pocket 19 having an opening at the top may be integrally injection molded on the rear side of the bottom plate (designated at 15B) in the second or third embodiment so that an identifier 20 for wafers W may be detachably inserted into this pocket 19 so as to allow control of information such as the type of wafers W and the like. Further, in the bottom plate 15 of the second or third embodiment, guide member 9A to be integrally formed by injection molding may be formed only on the both sides of the periphery of each passage hole. Further, in contrast to the above third embodiment, a pair of engaging recessed portions 17 having a semicircular section can be injection molded on the outer surfaces of paired positioning ribs 5 while a pair of engaging projected portions 16 having a semicircular section can be injection molded on the inner sides of guide member 9A.

As has been described, in accordance with the invention, in the case where a storage container for precision substrates is formed by injection molding or any other molding technique, it is possible to reduce or inhibit molding failure such as shrinkage etc., and lowering of productivity. Further, the invention enables the container to be positioned with precision and enables it to be applied not only to an automatic machine of the same type but also to an automatic machine having different specifications.

What is claimed is:

1. A storage container for precision substrates, comprising:
   a container body accommodating precision substrates;
   a plurality of positioning means which are integrally molded on one face of the container body in projected forms; and
   separate guide members each having outer end faces located at least on the sides around each positioning means, characterized in that the end face of each positioning means is shaped in a concave form which gradually becomes narrowed from the exterior to the interior of the concave opening, and the outer end faces of each guide member are formed gradually slanted from the exterior to the interior so as to form guide faces which are approximately continuous to the surface of the concavity.

2. A storage container for precision substrates, having a container body accommodating precision substrates which has a plurality of projections molded on the undersurface thereof, characterized in that:
   each projection is composed of a thin walled positioning means projectively molded integrally with the undersurface of the container body and a separate guide member having outer end faces located at least on both sides around the positioning means;
   the front end face of the positioning means is formed with a concavity, which gradually becomes narrowed from the exterior to the interior of the concave opening; and
   the outer end faces of the guide member are formed gradually slanted from the exterior to the interior so as to form guide faces which are approximately continuous to the surface of the concavity.

3. A positioning structure for a storage container for precision substrates, having a container body accommodating precision substrates has a plurality of projections molded on the undersurface thereof, characterized in that:
   each projection is composed of a thin walled positioning means projectively molded integrally with the undersurface of the container body and a separate guide member having outer end faces located at least on both sides around the positioning means;
   the front end face of the positioning means is formed with a concavity, which gradually becomes narrowed from the exterior to the interior of the concave opening; and
   the outer end faces of the guide member are formed gradually slanted from the exterior to the interior so as to form guide faces which are approximately continuous to the surface of the concavity.

4. The storage container for precision substrates according to claim 1, further comprising a bottom plate positioned on one surface of the container body, wherein the bottom plate is provided with a plurality of passage holes and guide members formed on, which each have outer end faces located at least on both sides around each positioning means.

5. The storage container for precision substrates according to claim 2, further comprising a bottom plate positioned under the undersurface of the container body, wherein the bottom plate is provided with a plurality of passage holes and guide members formed on, which each have outer end faces located at least on both sides around each positioning means.

6. The storage container for precision substrates according to claim 4, wherein each guide member is made to reside in close contact with the corresponding positioning means.

7. The storage container for precision substrates according to claim 5, wherein each guide member is made to reside in close contact with the corresponding positioning means.

8. The storage container for precision substrates according to claim 4, wherein an engaging recess is formed in the opposing face of either the guide member or the positioning member while an engaging projection is formed in the opposing face of the other so that the engaging recess and projection mate with each other.

9. The storage container for precision substrates according to claim 5, wherein an engaging recess is formed in the opposing face of either the guide member or the positioning member while an engaging projection is formed in the opposing face of the other so that the engaging recess and projection mate with each other.

10. The storage container for precision substrates according to claim 6, wherein an engaging recess is formed in the opposing face of either the guide member or the positioning member while an engaging projection is formed in the opposing face of the other so that the engaging recess and projection mate with each other.

11. The storage container for precision substrates according to claim 7, wherein an engaging recess is formed in the opposing face of either the guide member or the positioning member while an engaging projection is formed in the opposing face of the other so that the engaging recess and projection mate with each other.

12. The storage container for precision substrates according to claim 1, wherein the positioning means is formed of a pair of positioning ribs projected on one surface of the container body so as to be opposed to each other, and the outer end face of the paired positioning ribs is molded so that the section thereof is in an approximately V-shape.

13. The storage container for precision substrates according to claim 2, wherein the positioning means is formed of a pair of positioning ribs projected from the undersurface of the container body so as to be opposed to each other, and the outer end face of the paired positioning ribs is molded so that the section thereof is in an approximately V-shape.

14. The storage container for precision substrates according to claim 12, wherein a reinforcing rib is provided across the gap between the pair of positioning ribs.

15. The storage container for precision substrates according to claim 13, wherein a reinforcing rib is provided across the gap between the pair of positioning ribs.

16. A method for positioning and mounting a storage container for precision substrates on a stage of an automatic machine, wherein the storage container for precision substrates comprises: a container body accommodating precision substrates; a plurality of positioning means which are integrally molded on one face of the container body in projected forms; and separate guide members each having outer end faces located at least on the sides around each positioning means, and the end face of each positioning is shaped in a concave form which gradually becomes narrowed from the exterior to the interior of the concave opening, and the outer end faces of each guide member are formed gradually slanted from the exterior to the interior so as to form guide faces which are approximately continuous to the surface of the concavity, the method comprising: moving the container to position each concave portion of each of the plurality of positioning means on a corresponding one of a plurality of positioning pins of the automatic machine, wherein each positioning pin is adapted to be slidable in contact with the guide surface of the guide member into the corresponding concavity of the positioning means.

17. A method for positioning and mounting a storage container for precision substrates on a stage of an automatic machine, wherein the storage container for precision substrates comprises a container body for accommodating precision substrates which has a plurality of projections molded on the undersurface thereof, and each projection is composed of a thin walled positioning means projectively molded integrally with the undersurface of the container body and a separate guide member having outer end faces located on at least both sides around the positioning means; the front end face of the positioning means is formed with a concavity, which gradually becomes narrowed from the exterior to the interior of the concave opening; and the outer end faces of the guide member are formed gradually slanted from the exterior to the interior so as to form guide faces which are approximately continuous to the surface of the concavity, the method comprising: moving the container to position each concave portion of each of the plurality of positioning means on a corresponding one of a plurality of positioning pins of the automatic machine, wherein each positioning pin is adapted to be slidable in contact with the guide surface of the guide member into the corresponding concavity of the positioning means.

* * * * *